(12) United States Patent
Danovitch et al.

(10) Patent No.: US 7,038,462 B2
(45) Date of Patent: May 2, 2006

(54) METHOD AND APPARATUS FOR ELECTRICAL COMMONING OF CIRCUITS

(75) Inventors: David Danovitch, Canton de Granby (CA); Richard Langlois, Granby (CA); Martin Lapointe, Granby (CA); Robert-Paul Leclerc, Granby (CA)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/710,145

(22) Filed: Jun. 22, 2004

(65) Prior Publication Data

US 2005/0062493 A1 Mar. 24, 2005

(30) Foreign Application Priority Data

Sep. 18, 2003 (CA) .................................. 2441447

(51) Int. Cl.
*G01R 31/08* (2006.01)
*G01R 31/02* (2006.01)

(52) U.S. Cl. ...................................... 324/518; 324/765

(58) Field of Classification Search ................ 324/518, 324/765
See application file for complete search history.

(56) References Cited

U.S. PATENT DOCUMENTS

| 4,287,406 A | 9/1981 | Davies ........................ 219/155 |
| 4,712,674 A * | 12/1987 | Young ......................... 206/721 |
| 5,008,617 A * | 4/1991 | Czubatyj et al. ............. 324/750 |
| 5,206,585 A * | 4/1993 | Chang et al. ................ 324/754 |
| 5,798,655 A | 8/1998 | Kazama et al. .............. 324/761 |
| 5,850,144 A * | 12/1998 | Howells et al. .............. 324/559 |
| 5,910,878 A * | 6/1999 | Mello et al. ................. 361/212 |
| 6,043,670 A * | 3/2000 | Degani et al. ............... 324/765 |
| 6,049,215 A | 4/2000 | Agahdel et al. ............. 324/758 |
| 2002/0027444 A1 | 3/2002 | Jones et al. .................. 324/754 |
| 2002/0060583 A1* | 5/2002 | Kimura et al. ............... 324/765 |
| 2005/0046435 A1* | 3/2005 | Ishikawa et al. ............. 324/765 |

* cited by examiner

*Primary Examiner*—Anjan Deb
(74) *Attorney, Agent, or Firm*—Lisa U. Jaklitsch

(57) ABSTRACT

Improved methods and apparatus is disclosed for electrical testing of electronic circuits such as those existing in microcircuit devices including chip carriers, printed circuit boards and substrates. The invention provides for the testing of the continuity of electronic circuits in progressively smaller devices having increased density of circuits and having pads closely spaced. A quasi-fluidized bed of conductive particles is provided for effectively contacting pads on a first side of a substrate. Pads on another side of the substrate which are connected to the pads on the first side are then contacted by a test device. The circuit interconnecting respective pads on the two sides of the substrate can then be assessed for electrical continuity.

20 Claims, 3 Drawing Sheets

METHOD AND APPARATUS FOR ELECTRICAL COMMONING OF CIRCUITS

BACKGROUND OF INVENTION

This invention relates to electrical testing of electronic circuits and in particular improved methods and apparatus for testing electronic circuits such as those existing in chip carriers, printed circuit boards, substrates and other microcircuit devices.

Flaws resulting in manufacturing processes of microcircuit devices can create undesired electrical conditions in electrical circuits contained within such devices resulting in flawed or inoperable electrical circuits wherein the flawed circuits do not function as originally intended and designed. In order to verify the electrical integrity of electronic circuits such as those present in chip carriers, printed circuit boards, electronic substrates or other microcircuit devices, during manufacture of such devices such circuits are typically submitted to electrical testing in an effort to detect unintended design flaws such as conditions of electrical shorts or opens in the circuits.

There is a significant ongoing design and manufacturing effort within the electronics industry to create physically smaller and more compact electronic components and substrates. When attempting to make smaller substrates, the density of the electronic circuits on the substrates increases and it is a requirement that the pads on the substrates be placed much closer together compared to substrates using less dense electronic circuits. With increases in electronic circuitry density the contact pads, which represent extremities of the circuits are spaced ever-closer together, especially in the region of the substrate where relatively smaller chips or components are to be subsequently connected. This causes difficulties in effecting contact of the desired individual circuit contact pads on the surface of the substrate for purposes of detecting undesired electrical conditions in the individual circuits.

Typical substrates, for example, chip carriers, printed circuit boards, electronic substrates, or similar devices, comprise electronic circuits and the substrates physically and spatially support the electronic circuits. A substrate comprises non-conductive material so that it does not interfere with the normal operation of the electrical circuits supported thereon. These arrangements are well known in the art. The substrate typically includes electronic circuits and a first group of pads located on one surface of the substrate, with the pads electrically connected to one or more of the electronic circuits. The pads are used to connect the electronic circuits to a first electronic device, for example, an electronic chip. A second group of pads located on another surface of the substrate, are electrically connected to the electronic circuits and intended to connect the electronic circuits to a second electronic device, for example, a printed circuit board. The electronic circuits form a plurality of predetermined conductive pathways between the first and second groups of pads on the substrate.

A known approach used for testing and detecting undesired electrical conditions such as open circuits, where contact pads are relatively closely spaced is referred to as electrical-commoning. With this approach, all the contact pads of one group of pads which represent all the first extremities of the electronic circuits of the substrate are electrically shorted. The electronic circuits are all thus effectively shorted and connected together. Test probe devices are contacted to the second group of pads which represent the other extremities of the electronic circuits and which pads are typically spaced further apart from each other than those pads at the first extremities of the circuits. The test probes are connected to a test mechanism for testing the electronic circuits for adverse electrical conditions and verify whether the electronic circuits exhibit any adverse electrical conditions. Electrical continuity-testing of electrical circuits may be carried out with the use of, for example: an ohm meter, a voltmeter, an ammeter, or equivalent, in order to verify the electrical integrity of electronic circuits by detecting undesired electrical conditions in the circuitry, as is well known in the industry.

Problems exist resulting from the use of known electrical-commoning methods and apparatus for detecting undesired electrical condition of electronic circuits on substrates which could produce "false open" results. These problems include:

the electrical-commoning mechanism does not making suitable contact with the contact pads;

the pads are contaminated, for example, by a non-conductive substance on the pads which substantially prevents electrical contact being made between the pads and the electrical-commoning mechanism;

one or more pads may be deformed, thus creating a condition where the pad does not make contact with the electrical-commoning mechanism;

the electrical-commoning means is not sufficiently locally compliant with the pads resulting in ineffective electrical contact;

the electrical-commoning mechanism does not have a capability to overcome aspects of "self-damage" that may be reflected in the contacts so that a reliable commoning of the contact pads can be effected, for example, the self-damage being caused by contaminants, or the pads having surface inconsistencies, or the electrical-commoning mechanism having surface inconsistencies; and the electrical-commoning means may deposit an unwanted residual electrically non-conductive material on the surface of the pads and the substrate, such that it may be difficult to remove the residual material from the pads and the substrate after testing is performed.

Known prior art attempts to solve the above and other problems associated with electrical-commoning approaches presently used include the use of a flexible sheet, for example, a conductive polymeric sheet or metallized polymeric sheet as described in U.S. Pat. No. 5,898,311 issued Apr. 27, 1999, entitled Shorting Pad Having A Flexible Conductive Sheet and U.S. Pat. No. 5,900,316 issued May 4, 1999, entitled Flexible Conductive Sheet, both of which are assigned to International Business Machines Corporation. However, difficulties may arise with the use of such polymeric sheets in that:

the sheet may leave a residual contamination on the surface of the pads and substrate during the test which may be difficult to remove;

the sheet has a capability of being susceptible to physical damage when contacting the pads;

the sheet requires relatively large contact forces to ensure that the polymeric sheet makes sufficient contact with all of the pads and the large forces may result in damage to the substrate and any test fixture; and the sheet may be insufficient to completely prevent "false opens" because the polymeric sheet does not have sufficient capability for being substantially and completely locally compliant with the contact pads.

From the above description, it should be appreciated that there is a need for improvements in the testing of electrical circuits that are manufactured on substrates and in particular a need for a new approach to temporarily electrically common or short such circuits. A novel and unobvious solution is needed to provide an electrical-commoning mechanism that overcomes the aforementioned problems inherent in the prior art.

SUMMARY OF INVENTION

Therefore, an important objective for manufacturers of substrates is their constant desire to find and detect circuits which are flawed and which contain undesired electrical conditions, to thereby reduce manufacturing waste, reduce customer complaints, and the like.

The present invention provides a method and apparatus for electrically commoning the electronic circuits supported by a substrate, and to effectively and cost efficiently in a timely manner to determine the existence of undesired electrical conditions associated with the electronic circuits to thereby reduce costs associated with manufacturing waste and customer complaints. Flaws in manufacturing processes which may have caused an occurrence of undesired electrical conditions in the electrical circuits thereby creating flawed electrical circuits not being able to function as expected or desired can be effectively detected at an appropriate early stage of the assembling process.

The present invention provides a method and apparatus for testing the continuity of electronic circuits and to accommodate requirements to make even smaller electronic devices in attempts to physically decrease the size of substrates thereby increasing the density of the electronic circuits and subsequently placing the pads much closer together compared to electronic circuits used in less dense circuits.

According to one aspect of the present invention, there is provided an apparatus for use with a substrate supporting a plurality of contact pads for electrically commoning the contact pads. The apparatus comprises a container for confining a quantity of electrically conductive particles and having said substrate positioned within said container having a first group of a plurality of contact pads on a first surface thereof in contact with said particles. At least some of said electrically conductive particles contact other of said particles and said contact pads of said first group of contact pads on said surface of said substrate and means to maintain said particles in contact with the surface of said substrate and said contact pads whereby said contact pads are electrically commoned.

According to another aspect of the present invention, there is provided a method for electrically commoning contact pads located on a first surface of a substrate wherein each pad is connected to a circuit supported by said substrate. The method comprises the steps of providing a container for confining electrically conductive particles and providing a supply of electrically conductive particles in said container. A substrate having a first group of a plurality of contact pads on one surface thereof is placed and held in said container such that the pads contact said particles and the particles are maintained in contact with other of said particles and said pads whereby said pads are electrically commoned.

BRIEF DESCRIPTION OF DRAWINGS

The above and other objectives of the subject invention will be better understood with reference to the drawings in which.

DETAILED DESCRIPTION

Figure 1:
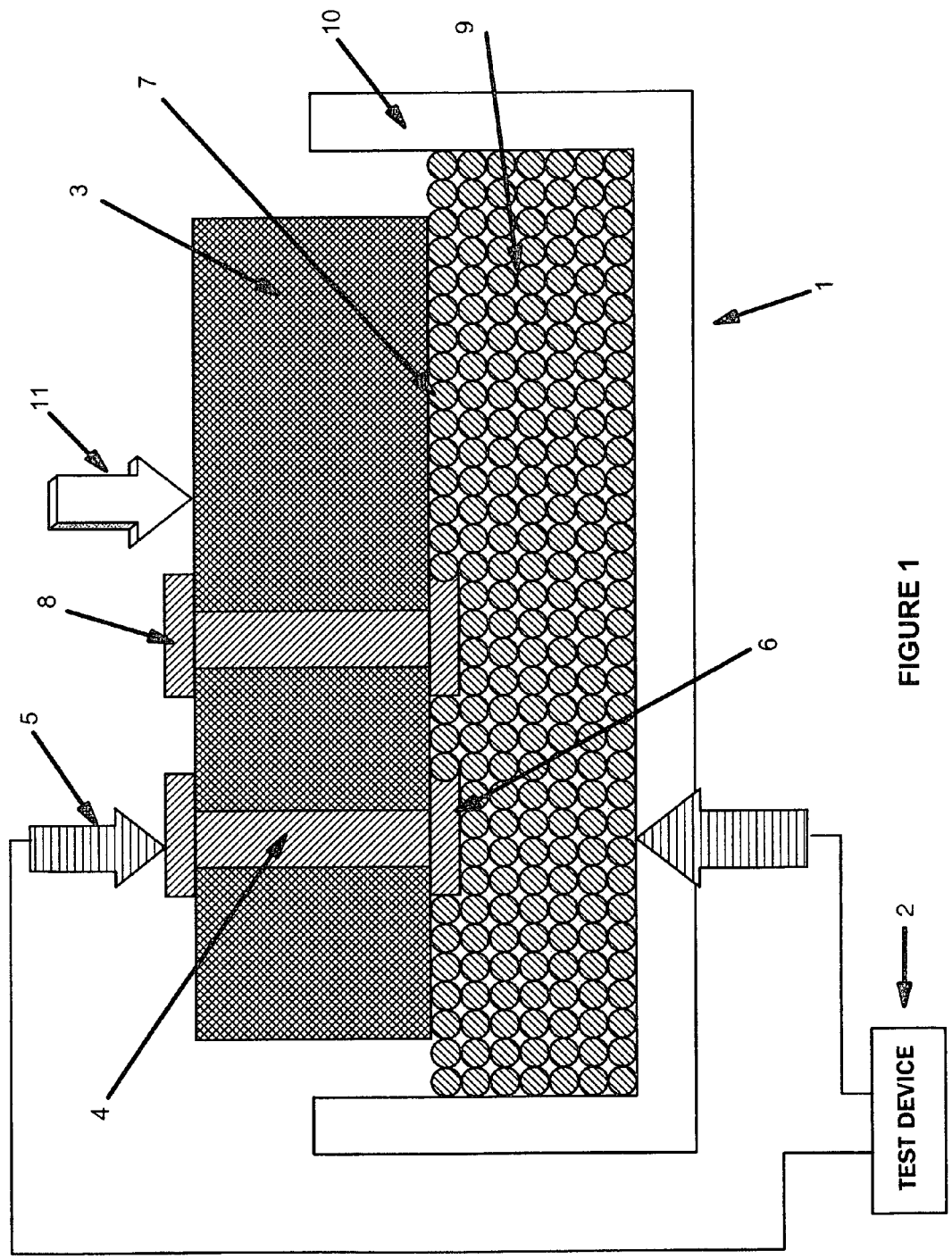
FIG. 1 shows a cross section drawing of a testing apparatus embodiment of the present invention.

The term "electrically commoning" of contact pads or electronic circuits as used in this disclosure has the same meaning as electrically shorting of pads or circuits, as is well known in the art.

An overview of aspects and advantages of the subject invention to effect the described electrical commoning of circuitry and to carry out electrical testing of circuitry while eliminating known problems of the prior art, will first be described followed by a more detailed description with reference to the drawings.

The disclosed invention incorporates the use of small electrically conductive particles, preferably but not limited to spheres, placed in a receptacle so as to somewhat limit the horizontal spreading of the particles. A suitable quantity of the particles for the container or receptacle can be determined to ensure that the surface of a substrate containing a group of electrical contacts or pads to be shorted will always come into contact with a minimum concentration of particles. The walls of the receptacle are made from suitable material that may be flexible, resilient or compliant, such as compressible rubber, with dimensions designed to ensure adequate compaction of the particles within the receptacle to allow the group of electrical contacts or pads to meet and be in physical and electrical contact with the contained particles. As such the particles simultaneously contact both themselves and the group of electrical contacts which are connected to the electrical circuits supported by the substrate to be tested.

The conductive particles are of dimensions which are sufficiently smaller than the dimensions of the contact pads such that numerous particles can individually and simultaneously contact each contact pad, but large enough to avoid the risk of adhering or becoming attached to the contact pads or substrate surface. The exterior of the particles comprise electrically conductive and non-oxidizing material such as but not limited to gold or platinum. One means to effect such a coating on the particles is by the use of a suitable electrolyses plating bath. The exterior surface of each conductive particle is sufficiently rigid to prevent excessive deformation or agglomeration of the particles, thus maintaining the original ability of the particles to be moveable and to contact themselves and the pads. In one embodiment of the invention, the core material of the metal particles is magnetic in nature such that the particles can be moved by the use of an external alternating magnetic field. In another embodiment, where the particles can be moved by ultrasonic means, the core of each particle may be made of magnetic or non-magnetic material.

As may be appropriate after testing, the substrate surface may be subjected to a cleaning operation by blowing inert gas across the surface of the substrate to remove any residually adhering conductive particles.

Having the size of the particles somewhat smaller than the dimension of the contact pads ensures that the loosely compacted particles, when retained in the receptacle of the apparatus, acts in a quasi-fluid nature. The overall surface formed by the particles within the container/receptacle, is thus compliant and readily changes shape to accommodate the shapes and positions of the contact pads supported by a substrate. In this way the bed of particles effectively acts to electrically common or short the contact pads. Numerous advantages follow from this arrangement.

If a portion of a surface of a contact pad is covered by a non-conductive material as by contamination or by design, the remaining conductive portion of the contact pad will still be contacted by some of the particles to ensure meaningful test results. In addition, with the use of particles of such small size the physical requirements and constraints resulting from greater density of contact pads on a surface of a substrate and decreasing contact pad pitch/size will be accommodated for the testing of the connected circuitry.

This adaptability of the particle bed allows for effective contacting of contact pads which may be located somewhat lower than the overall substrate surface. This is the case, for example, with printed circuit boards which may contain a non-conductive solder mask of approximately 20–30 microns thickness on their surfaces with openings, typically approximately 150 microns in diameter, in the solder mask to reveal the contact pads below the surface thereof. The contact pads are therefore effectively 20–30 microns below the surface. The particles, being significantly smaller in diameter than the diameter of the openings in the mask and being in the form of a compliant bed of particles, will effectively enter the openings and make electrical contact with the pads.

The quasi-fluid nature of the particle bed in the container is not adversely affected by or susceptible to physical damage from any irregular shapes or protrusions from a hard ceramic substrate with contact pads. The particle bed can be re-used almost indefinitely to perform the testing operation.

The rigid nature of the core component of the electrically conductive particles prevents deformation and/or agglomeration of the particles within the container and maintains the ability of the particles to contact each other and the pads. The compliant nature of the particle bed is maintained and the nature of the particles reduces potential contamination of the contact pads by the particles. The non-oxidizing nature of the exterior surface of these particles ensures consistent contact between adjacent particles and between the particles and contact pads. The combination of the use of these described particles in a container or receptacle having compliant walls efficiently provides for the contacting of the pads with the particles using relatively small forces to achieve the commoning of the pads on a substrate.

Where the core component of the particles is magnetic in nature a varying magnetic field may be used to maintain the particles in constant motion during electrical contact with the pads and the subsequent performance of the electrical test. This results in effective electrical contact of particles with the pads through constant homogenization of the "particle fluid bed" while minimizing the extent to which the particles adhere to themselves and to the contact pads or to the substrate itself. Ultrasonic means to place the particles in appropriately constant motion may achieve similar advantages and allowing for the particles to be made from a variety of materials.

With reference to FIG. 1 of the drawings, details of a testing apparatus embodiment 1 of the present invention will now be described. This embodiment comprises container or receptacle 10 for confining conductive particles 9 and causing particles 9 to physically touch other particles thereby electrically shorting physically touching particles 9. Container 10 and other aspects of this embodiment maintains some shorted particles 9 in physical contact with pads 6 of a first group of pads 6 located on a first surface 7 of substrate 3 when a contacting force generally shown by arrow 11 is applied on substrate 3 and forceing pads 6 to physically touch some of the shorted particles 9. Contacting force 11 may be created and applied by any appropriate means as would be known to those having ordinary skill. Since a sufficient quantity of particles 9 exist in container 10, pads 6 of the first group of pads on the first surface 7 of substrate 3 are thereby substantially electrically commoned or shorted together.

Substrate 3 further comprises circuits 4, such as conductive vias within substrate 3, which are connected to pads 6 of the first group of pads 6. Since electronic circuits 4 are connect to pads 6, circuits 4 are also electrically shorted or commoned by particles 9.

Substrate 3 further comprises a second group of pads 8 located on another surface of the substrate other than surface 7 of substrate 3 as shown. Pads 8 are electrically connected to the aforementioned electronic circuits 4 as shown. Substrate 3 physically separates the second group of pads 8 from the pads of the first group of pads 6 and further prevents the second group of pads 8 from physically touching particles 9.

Embodiment of FIG. 1 further comprises test device 2 and includes one or more test probes 5 shown electrically connected thereto and contacted to pads of the second group of pads 8. Typically a test probe 5 is connected to each pad 8. Test device 2 is also electrically connected to conductive contacting particles 9 contained within container 10. Test device 2 is thus capable of detecting the electrical conditions of the electronic circuits 4 connected to test probes 5 and in particular any flaw or undesirable electrical condition existing in each circuit. In practice, test probe 5 would be moved from one contact pad 8 to another contact pad 8 and electrical contact would be made in turn to each of the contact pads 8 in the second group of contact pads to thereby in turn assess the electrical condition of each of the circuits 4 connected to pads 8 and thereby detect any undesirable electrical opens existing in circuits 4.

As previously described, particles 9 are electrically conductive thereby achieving the desired shorting or commoning relationship when they are in contact with each other and with pads 6 when located within container 10. In a preferred embodiment, particles 9 are essentially spherical in shape and have an exterior surface thereon of a non-oxidizing material to prevent formation of electrically insulating oxide on the surface of the particles, thereby ensuring that particles 9 are electrically contacted to each other and to pads 6 when assembled within container 10. Particles 9 may consist of a core and have an exterior surface coating formed, for example, by the use of an electroless plating bath. The inert coating on particles 9 prevent particles 9 from imparting any contamination to the pads of the first group of pads 6 and surface 7 of substrate 3.

Various materials could be used for particles 9. The core material could be any electrically conductive material, for example, ferro magnetic materials such as iron, nickel or cobalt. The core of particles 9 could also consist of suitable non-conductive material including plastic, with an exterior coating of electrically conductive material including gold or platinum. Particles 9 could also be made of all one material such as gold.

As examples of sizes of elements which have been used in association with the present invention, a substrate of 1.5 inches square having a chip size of 0.5 inches square, include contact pads of 0.005 inches in diameter and a pitch or spacing between pads of 150–250 microns. Particles in the range of 25–30 microns have been found to be practical.

Particles 9 are sufficiently rigid to prevent excessive agglomeration of the particles thereby allowing particle 9 to be freely moved within container 10 and to contact pads 6. The characteristics of particles 9 prevent them from becoming substantially gathered into a heap or localized when a contacting force 11 is applied to substrate 3 and thus particles 9. However on the other hand particles 9 form a quasi-fluid bed and this bed of particles is suitably compliant, flexible or resilient to ensure an extended usable life of the bed of particles by preventing individual particles 9 from being subjected to physical damage. Particles 9 in the bed of particles as described are capable of being reversibly deformed, wherein a deformation of the particle bed allows the bed of particles to resume its original shape thereby preventing the bed of particles from becoming permanently misshapen after the contacting force is removed. The contacting force may temporarily deform the bed of particles, and after the contacting force is removed, the bed of particles resumes its original shape.

The size of particles 9 is selected to ensure accommodation of sufficient particles for the surface area of each pad 6. Preferably the particles are sufficiently large so as not to become wedged in the space between pads 6 during the testing procedure and small enough so that more than one particle contacts the surface of a pad 6. In addition the size and number of particles 9 in a particular application are sufficient to make electrical contact with pads 9 even when a portion of pad surface may be covered by a non-conductive material. A predetermined number of particles can be determined to suitably cover the surface area of pads 6.

In general it has been found useful results are achieved when the diameter of a spherically shaped particles 9 is about ⅓ the diameter of the surface of pad 6. The quantity of particles 9 to exist in container 10 for useful results varies on a number of factors including size of surface 7 of substrate 3 and configuration of pads 6. It has been found in general that the thickness of the bed of particles 9 should be at least as thick as the height of pads 6 above surface 7.

Container 10 has side walls to contain and limit the horizontal spreading of particles 9 and to maintain particles in a predetermined volume of space. The walls of container 10 are preferably resilient, flexible and compliant to enhance the desire of having some particles 9 which are contacting each other when an appropriate force 11 is applied to touch pads 6 of substrate 3. The walls of container 10 are preferably made of suitable flexible material and are of dimensions so as to ensure an adequate compression of particles 9 when substrate 3 and pads 6 thereon is placed in container 10 such that pads 6 contact some of particles 9.

Contacting force 11 is applied to substrate 3 to cause susbtrate 3 with pads 6 on surface 7 thereof to physically contact the particles 9. The contacting force 11 is sufficiently strong to maintain pads 6 in stable contact with at least some of particles 9 whereby particles 9 make conforming contact with pads 6 during application of force 11. Force 11 is maintained on substrate 3 to cause pads 6 to contact particles 9 for a sufficient time in order to have the test performed. The combination of applied force 11 and the force resulting from the flexibility of the walls of receptacle 10 is such as to ensure damage is not imparted to substrate 3 or contacts 6 by the bed of particles 9.

Substrate 3 may be connected to other electronic components while the circuitry 4 supported by substrate 3 is being tested. As had been described, the first and second groups of pads on substrate 3 as shown by references 6 and 8 respectively, may be electrically connected to an electronic chip or a printed circuit board, for example.

Tester or test device 2 is used to detect undesired electrical conditions such as electrical opens existing in the electronic circuits 4. Test probes 5 are caused to sequentially make electrical contact with pads 8 of substrate 6 during the testing of electronic circuits 4. Test device 2 could comprise any one or more of an ohm meter, a volt-meter, and an ammeter.

Another aspect of the embodiment of the present invention shown in FIG. 1 is a motion-inducing mechanism or means (not illustrated in FIG. 1) for causing particles 6 to move toward and touch or make contact with any available surface of pads 6 of substrate 3 thereby ensuring particles 6 to be in touch with the surface of pads 6. Such mechanism is not shown in FIG. 1. The suitable motion-inducing means could be one of the following mechanisms or a combination of any two or more of the mechanisms namely, a shaking-motion mechanism, a magnetic-field mechanism, or an ultrasonic mechanism. Such mechanisms for inducing motion to the particles are considered to be well known to those of ordinary skill. Of course for the magnetic-field mechanism to be effective, particles 9 of magnetic material would have to be employed. A shaking-motion mechanism induces a shaking and vibrating motion to particles 9 thereby causing particles 9 to move toward and make more effective electrical contact amongst themselves and with pads 6 of substrate 3. This results from the physical shaking and vibrating of particles 9 within container 10. By inducing a shaking motion to particles 9, the particles are caused to move in a back and forth motion with rapid jerky motions thereby causing the particles 9 to change their spatial positions to enhance greater contact with pads 6 and reduce the amount of test time required to effectively test circuitry 4 on substrate 3. An ultrasonic mechanism may be coupled to container 10 for causing particles 9 in a similar manner to shake and vibrate resulting in more effective electrical contact between particles 9 and pads 6 on substrate 3. The sound frequencies used may be beyond the range that can be heard by a human ear. A magnetic-field mechanism may be coupled to container 10 in which magnetic particles 9 exist. The magnetic-field mechanism imparts changing lines of magnetism to particles 9 which magnetically interact with particles 9 whereby particles 9 become churned so that freely available particles 9 make contact with any remaining available spaces on the surfaces of pads 6. This enhances the contact of particles 9 with pads 6 and thereby reducing the time to carry out the electrical tests on circuitry 4 of substrate 3. The magnetic-field mechanism may further entail a degaussing mechanism to remove residual magnetism from the particles thereby preventing the particles from adhering to pads 6 and to substrate 3. As had been previously mentioned, the mechanisms to provide for the shaking-motion, ultrasonic and magnetic field activity may be used individually or in any combination in order to enhance the contact of particles 9 with pads 6 on the surface of substrate 9.

Figure 2:
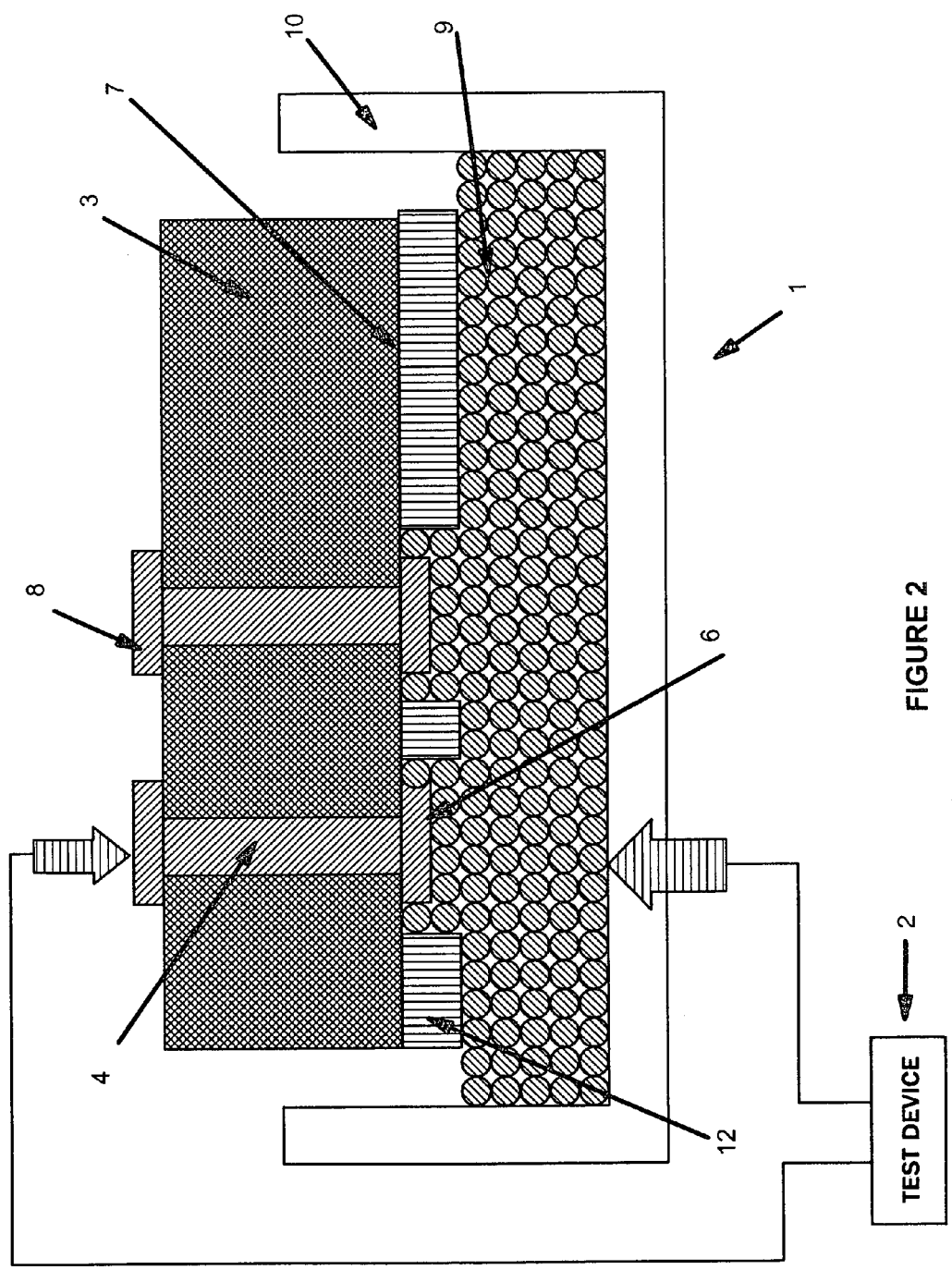
FIG. 2 shows the drawing of FIG. 1 incorporating a substrate having recessed pads.

FIG. 2 of the drawings illustrates use of the apparatus embodiment of FIG. 1 with a substrate 3 in which pads 6 are effectively recessed below the surface of substrate 3. In practical situations portions 12 of the surface of substrate 3 upon which contact pads 6 are located, may be covered by a non-conductive solder mask. Mask 12 has openings for providing access to pads 6 which are thus effectively recessed below the surface of the substrate 3. Particles 9 have a smaller size compared to the size of the opening in mask 12 and thus particles 9 are capable of entering the openings in mask 12 in order to make electrical contact with pads 6. Circuits 4 of substrate 3 are tested in a similar manner with the test apparatus and probes as shown and described with reference to FIG. 1.

Figure 3:
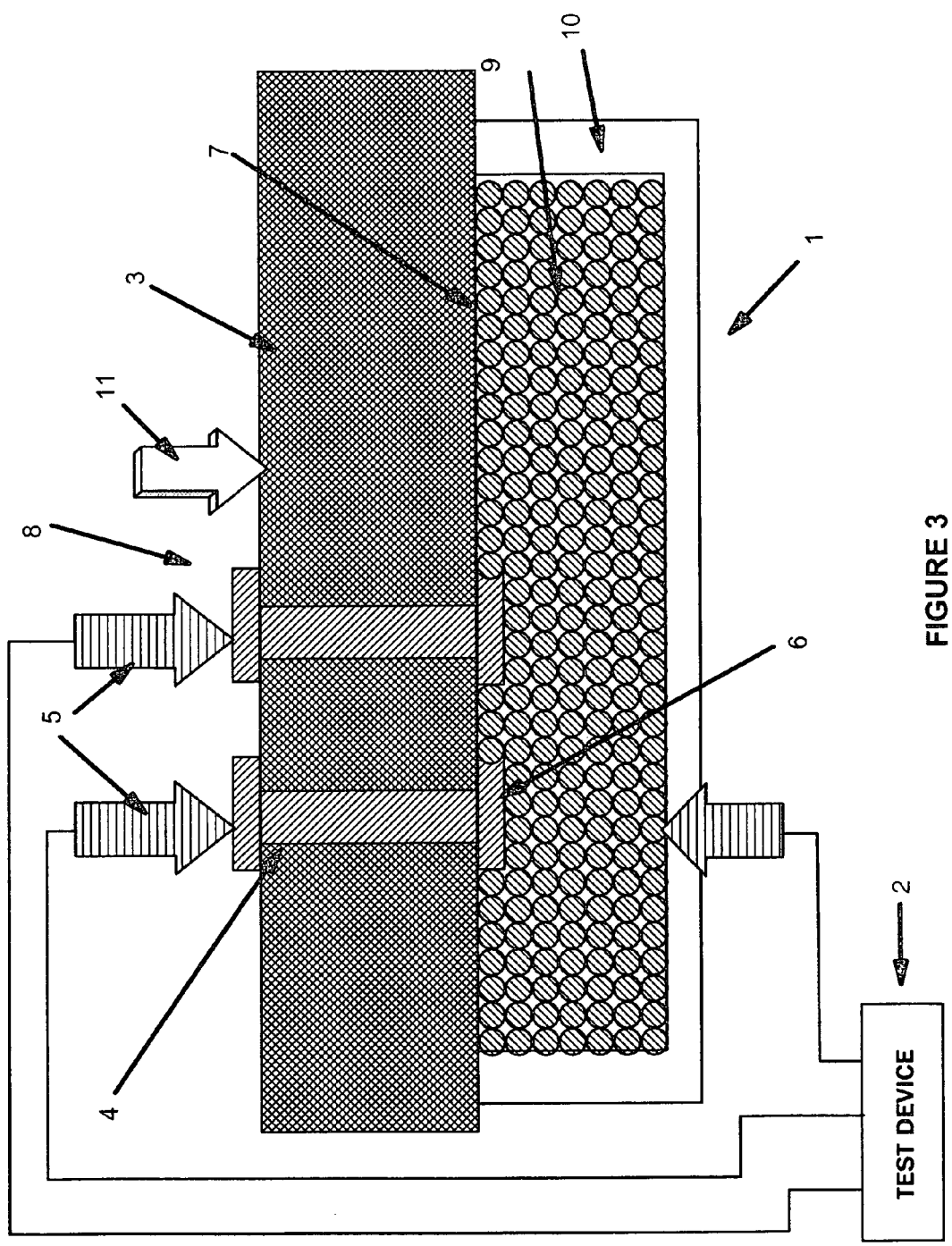
FIG. 3 shows a cross-sectional drawing of another embodiment of the testing apparatus accommodating a substrate positioned on flexible walls of a container.

FIG. 3 illustrates an alternative arrangement of the testing apparatus 1 of FIGS. 1 and 2. As shown in FIG. 3 container 10 for retaining particles 9, is designed so that substrate 3 is positioned on the walls of container 10. In this embodiment container 10 is made of appropriately resilient or compliant material so that the walls of container 10 change shape somewhat when substrate 3 is forced downward by applied force 11 for pads 6 to contact particles 9. It has been found that the resulting force of the resilient walls of container 10 enhances particles 9 contacting pads 6 along with the applied force 11. This arrangement assists in obtaining test results from the use of test device 2 and the associated probes. Also shown in the embodiment of FIG. 3 is an arrangement where each of pads 8 have a test probe 5 connected thereto during the testing process of circuits 4.

It is understood from the above description of the embodiments of the present invention with respect to FIGS. 1, 2 and 3, are provided for purposes of illustrating aspects of the subject invention. These drawings should not be considered as being to scale nor are intended in any manner to limit the nature, number, configurations or sizes of the various components or elements shown.

The invention has been described so far in terms of apparatus as generally illustrated in the drawings. The inventive aspects of the subject invention extends to methods of electrically shorting contacts pads such as pads 6 located on a surface of substrate 3. As can be appreciated with general reference to the drawings, a suitable container or receptacle 10 is provided for confining electrically conductive particles 9. A suitable supply of particles 9 is added to container 10. Substrate 3 having pads 6 on a surface thereof is placed into container 10, or alternatively on container 10, such that pads 6 make contact with particles 9. Substrate 3 is held within container 10 and a force may be applied thereto in order to ensure that the particles adequately contact each other and the pads whereby pads 6 become electrically shorted. Substrate 3 has a second group of pads 8 on a surface of substrate 3 different from the surface where pads 6 are located. Pads 6 and 8 are interconnected by circuitry 4 existing within or supported by substrate 3. In order to electrically test circuitry 4 for opens, pads 8 are electrically contacted with a test device 2 while substrate 3 is located within container 10 and pads 6 are shorted by particles 9 and test device 2 is electrically connected to particles 9. Pads 8 are contacted by the test device in order to test each circuit 4. It is preferable to remove any contamination on pads 6 and 8 prior to placing substrate 3 within container 10 and contacting by test device 2. In order to ensure effective electrical contact of pads 6 and particles 9 and also to speed up and ensure that proper test results of the various circuits 4 are obtained, shaking or vibration motion may be induced into particles 9 as a result of the use of shaking motion, ultrasonic or magnetic mechanism attached to container 10.

It will be understood from the foregoing description that various modifications and changes may be made to the preferred embodiments of the present invention without departing from its true intent and spirit. It is intended that this description is for purposes of illustration only and should not be construed in a limiting sense. It should be appreciated that particular arrangements shown or described are provided for convenience in presenting the invention and those having ordinary skill in the art would understand that the scope of the invention is not limited to the arrangements of the elements as shown. The scope of this invention should be limited only by the language of the claims which follow.

We claim:

1. An apparatus for electrically commoning contact pads disposed on a surface of a substrate, the apparatus comprising:
   a container for confining a plurality of electrically conductive particles;
   said electrically conductive particles, each of said electrically conductive particles being in contact with other electrically conductive particles so that said electrically conductive particles are electrically commoned, where at least some of said electrically conductive particles contact said contact pads so that said contact pads are electrically commoned; and
   means for maintaining said particles in contact with the surface of the substrate and with said contact pads.

2. An apparatus according to claim 1, wherein said substrate comprises electronic circuits electrically connected to said contact pads, whereby the electronic circuits are electrically commoned due to contact between said electrically conductive particles and said contact pads.

3. An apparatus according to claim 2, wherein said contact pads are a first group of contact pads on a first surface of the substrate, and the substrate further includes a second group of contact pads disposed on a second surface of the substrate, the second group of contact pads not being in contact with said electrically conductive particles.

4. An apparatus according to claim 3, further comprising an electrical test device, connected to at least one pad of the second group of contact pads and connected to said particles, for testing an electronic circuit connected to said pad of the second group of contact pads and at least one pad of the first group of contact pads.

5. An apparatus according to claim 4, wherein said electrically conductive particles are sufficiently rigid so as to prevent substantially permanent deformation thereto during testing by said test device.

6. An apparatus according to claim 4, wherein said electrical test device includes means for sequentially contacting separate pads of the second group of contact pads during testing by said test device.

7. An apparatus according to claim 6, wherein said electrical test device tests the electronic circuits to detect open circuits.

8. An apparatus according to claim 3, wherein said electrically conductive particles cover said first group of contact pads.

9. An apparatus according to claim 3, wherein said electrically conductive particles are substantially spherical in shape and each have a diameter approximately one-third that of a contact pad in the first group of contact pads.

10. An apparatus according to claim 1, wherein each of said electrically conductive particles has a surface of non-oxidizing electrically conductive material.

11. An apparatus according to claim 1, wherein said electrically conductive particles are made from at least one of gold and platinum.

12. An apparatus according to claim 1, wherein said electrically conductive particles have a coating made from at least one of gold and platinum.

13. An apparatus according to claim 1, wherein said means for maintaining said particles in contact with the surface of the substrate comprises means for causing motion of the particles toward the surface of the substrate and said contact pads, thereby maintaining electrical contact between said particles and said contact pads.

14. An apparatus according to claim 13, wherein said motion is caused by at least one of a shaking mechanism, a magnetic-field mechanism and an ultrasonic mechanism.

15. An apparatus according to claim 1, wherein said container has walls of a flexible material.

16. A method for electrically commoning contact pads located on a first surface of a substrate wherein each pad is connected to a circuit supported by said substrate, the method comprising the steps of:
 providing a container for confining electrically conductive particles;
 providing a supply of electrically conductive particles in said container;
 placing and holding the substrate in said container such that the pads contact said particles; and
 maintaining said particles in contact with other said particles and with said pads, whereby said pads are electrically commoned.

17. A method according to claim 16, further comprising the step of removing contaminant from the surface of the substrate and from the first group of contact pads prior to said step of placing and holding the substrate within said container.

18. A method according to claim 16, wherein the contact pads on the first surface of the substrate are a first group of contact pads, and the substrate includes a second group of contact pads located on a second surface of the substrate, each of the second group of pads being connected to one of the circuits, and said method further comprises the step of:
 contacting at least one of the second group of contact pads and said particles with a test device for testing a circuit connected between at least one pad of the second group of contact pads and at least one pad of the first group of contact pads.

19. A method according to claim 18, wherein contacting step further comprises sequentially contacting separate pads of the second group of contact pads during testing by said test device.

20. A method according to claim 18, further comprising the step of:
 maintaining said particles in contact with the surface of said substrate by causing motion of the particles toward the surface of the substrate and the first group of contact pads, thereby maintaining electrical contact between said particles and the first group of contact pads.

* * * * *